United States Patent [19]
Muri et al.

[11] Patent Number: 5,438,694
[45] Date of Patent: Aug. 1, 1995

[54] DISTORTION COMPENSATION FOR A PULSEWIDTH-MODULATED CIRCUIT

[75] Inventors: David L. Muri, Sunrise; Robert E. Stengel, Ft. Lauderdale, both of Fla.

[73] Assignee: Motorola, Inc., Schaumburg, Ill.

[21] Appl. No.: 103,374

[22] Filed: Aug. 9, 1993

[51] Int. Cl.[6] ............................................. H03F 3/38
[52] U.S. Cl. .................................... 455/341; 330/10; 330/251; 455/312
[58] Field of Search .............. 330/10, 207 A, 251; 332/109; 455/311, 312, 341, 127

[56] References Cited

U.S. PATENT DOCUMENTS

| | | |
|---|---|---|
| 4,427,952 | 1/1984 | Zumsteg . |
| 4,454,483 | 6/1984 | Baylor . |
| 4,628,529 | 12/1986 | Borth et al. . |
| 4,630,305 | 12/1986 | Borth et al. . |
| 4,949,048 | 8/1990 | Tokumo et al. ............... 330/10 |
| 4,967,165 | 10/1990 | Lee et al. . |
| 5,115,205 | 5/1992 | Holmes, Jr. ................... 330/10 |
| 5,126,684 | 6/1992 | Solomon ........................ 330/10 |

Primary Examiner—Edward F. Urban
Assistant Examiner—Chi H. Pham
Attorney, Agent, or Firm—Pedro P. Hernandez

[57] ABSTRACT

Pulsewidth-modulated amplifier (100) includes a controller (102) which provides for a set of compensated signals (114, 158 and 160). The compensated signals are used for driving a speaker (136). Controller (100) includes a storage area for storing distortion characteristics for the amplifier for a predetermined operational frequency range. The compensated drive signals (114, 158 and 160) help compensate for the electrical non-linear distortions that occur in amplifier (100) and thereby help reduce the output distortion of amplifier (100).

12 Claims, 6 Drawing Sheets

DISTORTION COMPENSATION FOR A PULSEWIDTH-MODULATED CIRCUIT

TECHNICAL FIELD

This invention relates in general to pulsewidth-modulated (PWM) circuits, and to a PWM circuit which provides distortion compensation.

BACKGROUND

PWM audio amplifier circuits exhibit distortion caused by electrical non-linear properties that may occur in the PWM circuit between the PWM control/timer logic and the load (speaker). Distortion in the amplifier can be caused by the turn on/turn off characteristics of the PWM circuit's drivers (e.g., field-effect transistor drivers). Distortion is also caused by the different electrical characteristics in the high and low side of the FET bridge drivers and bootstrap circuits. Since unwanted distortion effects the clarity of the output signal of the PWM circuit, a need exists for a circuit which can provide for distortion compensation for PWM circuits in order to lower the overall amount of distortion in the PWM amplifier.

DETAILED DESCRIPTION OF THE PREFERRED EMBODIMENT

Figure 1:
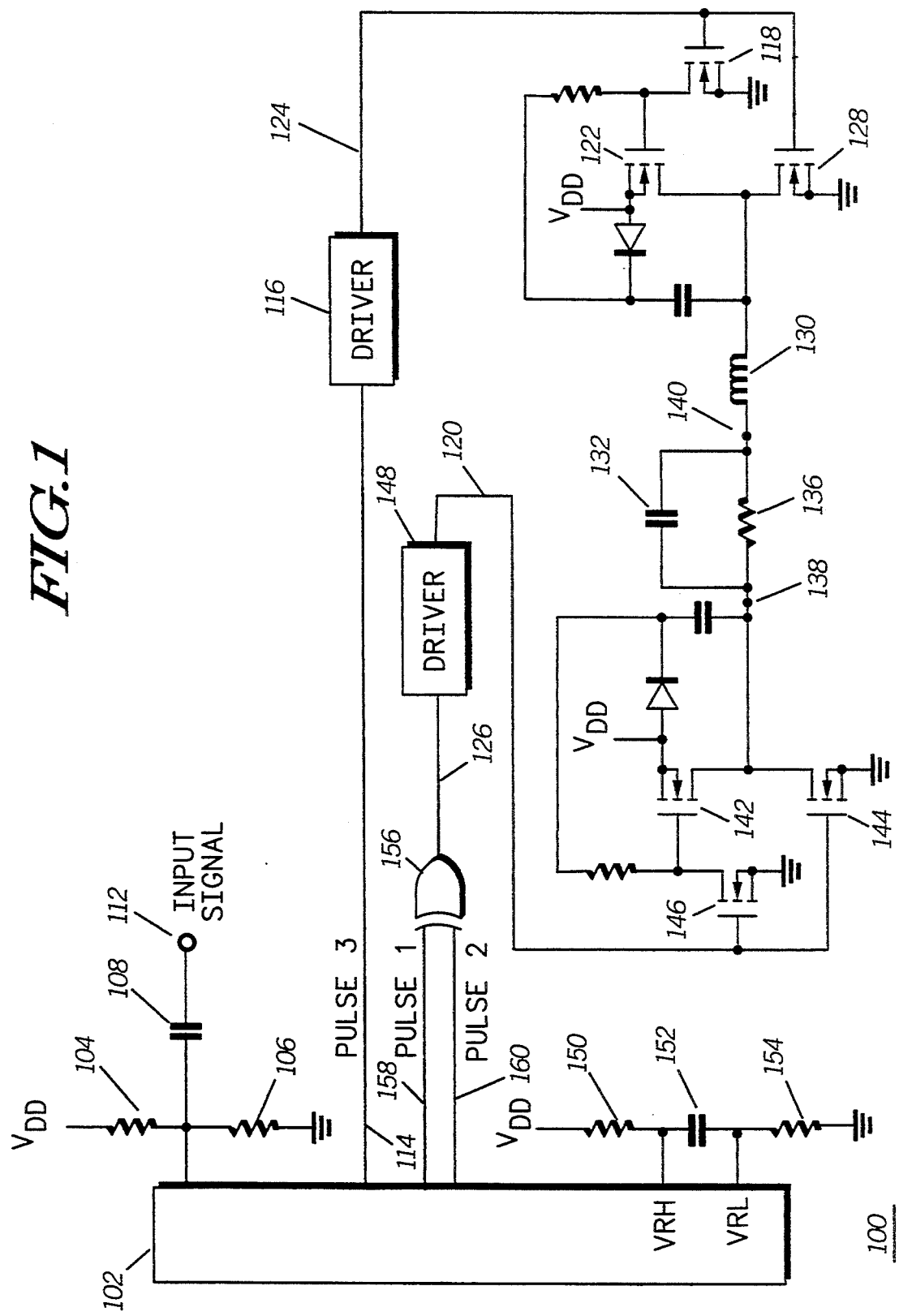
FIG. 1 is a block diagram of a PWM audio circuit in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a block diagram of a pulsewidth-modulated amplifier system (100) in accordance with the present invention is shown. Amplifier 100 includes a control means such as a microprocessor or microcontroller. Controller 102 preferably also includes a built-in storage section. The controller's storage section preferably includes RAM, EEPROM and PROM sections. In the preferred embodiment, an input means such as input terminal 112 receives an input signal such as an analog audio signal. The audio signal is capacitively coupled via capacitor 108 to a voltage-divider circuit formed by resistors 104 and 106. The input signal is then presented to controller 102.

Controller 102 in turn converts input signal 112 into 8-bit digital words using a built-in analog-to-digital (A/D) converter section located in controller 102. Controller 102 can be implemented using an M68I-IC11K4 microcontroller manufactured by Motorola, Inc. or other similar commercially available controllers having built-in storage, A/D conversion and input/output capabilities. A set of digital signals 114, 158 and 160 are then produced corresponding to the 8-bit digital word by controller 102 in order to recreate analog signal 112. A discussion of how these signals are compensated in accordance with the present invention will be discussed later on. A logic "EXCLUSIVE-OR" gate 156 combines signals 158 and 160 into one PWM signal 126, since controller 102 in the preferred embodiment has PWM section capable of generating a pulse centered in the middle of the sample period (a more detailed discussion of this can be found later on in relation to FIG. 10). Signal 114 acts as a polarity control, forcing the right side of the bridge circuit either to supply voltage (Vdd) or to ground potential.

Signals 114 and 126 are then sent to driver circuits 116 and 148. In the preferred embodiment, line drivers 116 and 148 are multiple MC14049 logic signal drivers coupled in parallel. Driver circuits 116 and 148 are used in order to provide the extra current drive capability that controller 102 or Exclusive-Or gate 156 can not provide to the bridge circuit.

The bridge circuit in the preferred embodiment is formed from a plurality of N-Channel field-effect transistors (FETs) 142-146, 118, 122 and 128. Each side of the bridge is driven by one of the drive signals 120 and 124. Although the bridge circuit has been shown using all N-Channel FETs, several different designs using P-Channel or a combination of N and P channel FETs can also be used. Coupled to each side of the bridge circuit are load terminals 138 and 140 respectively. Connected in series between load terminals 138 and 140 is a load shown in FIG. 1 as a resistive load 136, although in a typical implementation resistive load 136 is a speaker. Capacitor 132 is coupled between load terminals 138 and 140 and are located in parallel to speaker 136. An inductor 130 is preferably located in series between load terminal 140 and one side of the bridge circuit.

Figure 2:
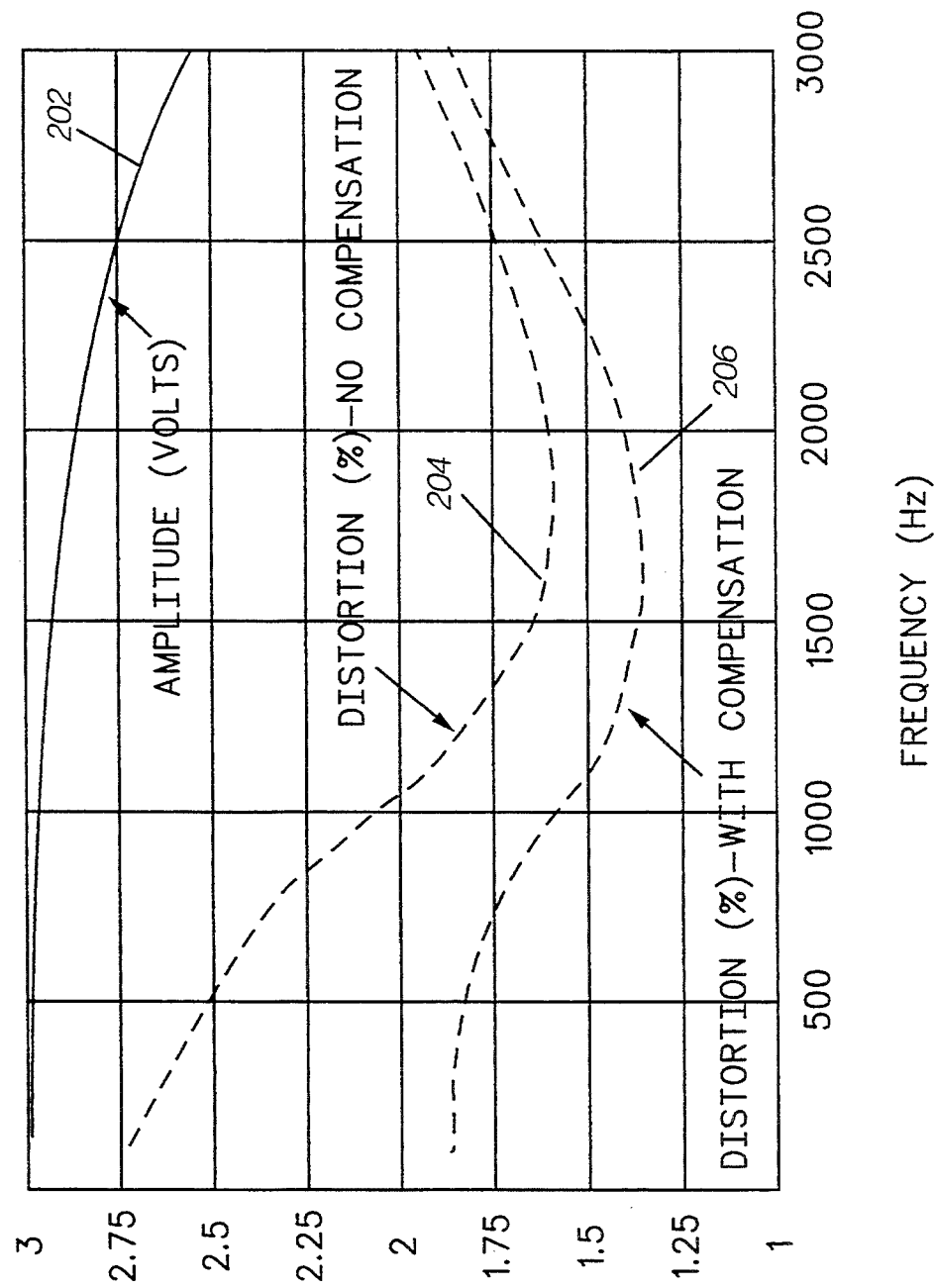
FIG. 2 is a graph showing the percentage of distortion for a compensated and non-compensated output signal over the audio band and the amplitude of the output signal in accordance with the invention.

Referring to FIG. 2, a graph showing the distortion of amplifier 100 with and without compensation is shown. Line 202 shows the amplitude in volts of the compensated output signal across load terminals 138 and 140, while line 204 shows the distortion percentage of audio amplifier 100 without the use of the compensation scheme of the present invention. Line 206 shows the percentage distortion across load terminals 138 and 140 using the compensation scheme of the present invention.

Figure 3:
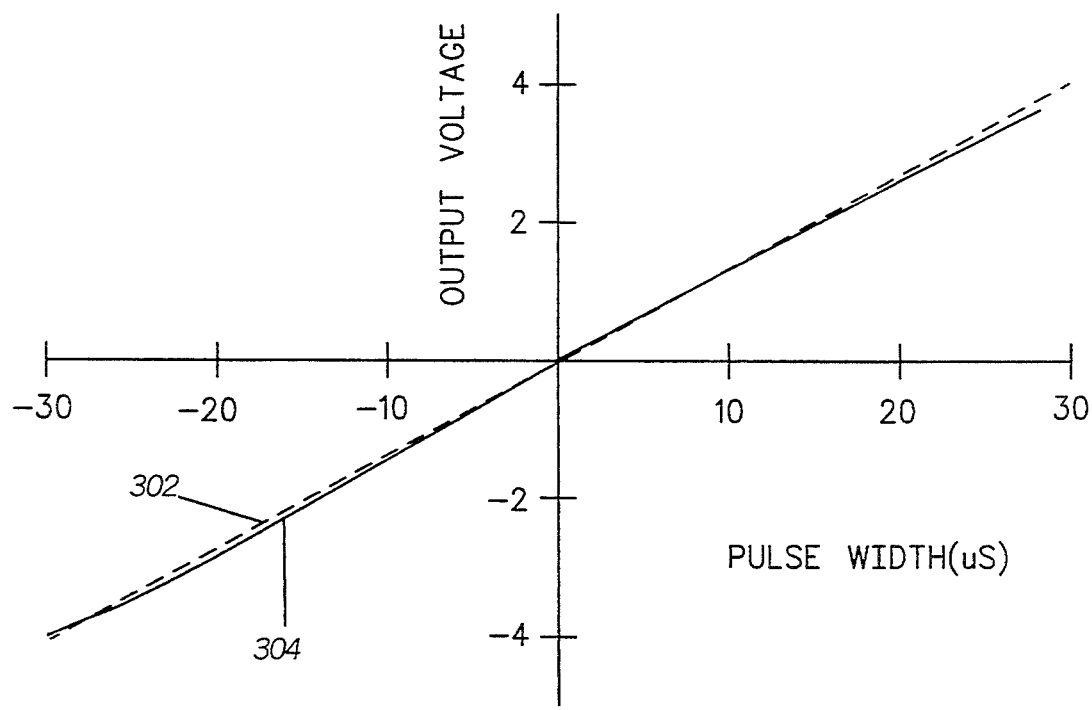
FIGS. 3, 5 and 7 show graphs of an uncompensated output signal versus pulsewidth on different scales in accordance with the present invention.

As shown in FIG. 3, the use of the present inventions compensation scheme helps to improve the distortion characteristics of amplifier 100 over the audio range (300–3000 Hz). As can be seen, the distortion percentage is less with compensation provided than without compensation. The graph in FIG. 2 was generated by using a signal generator such as an HP8904A signal generator manufactured by Hewlett Packard, Inc. as the signal source, and using a resistive load instead of a speaker across load terminals 138 and 140. An audio analyzer such as an HP8903B also manufactured by Hewlett Packard, Inc. was then used to measure the percentage distortion at the output terminals.

Figure 4:
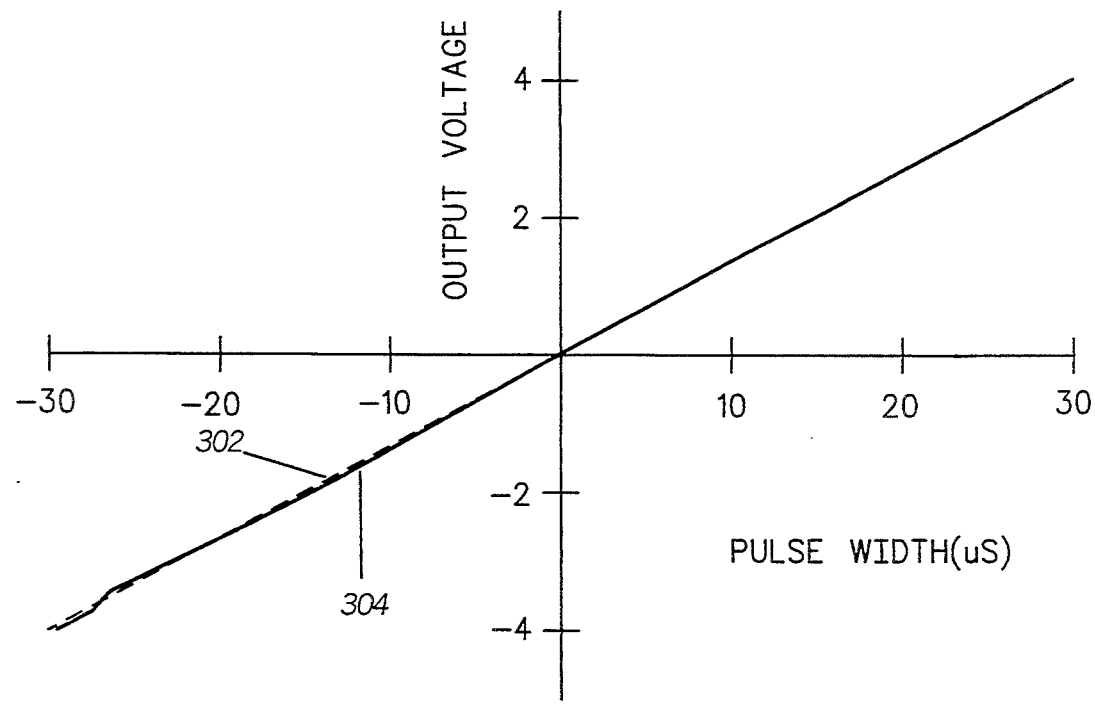
FIGS. 4, 6 and 8 show graphs of a compensated output signal versus pulsewidth on different scales in accordance with the present invention.
Figure 5:
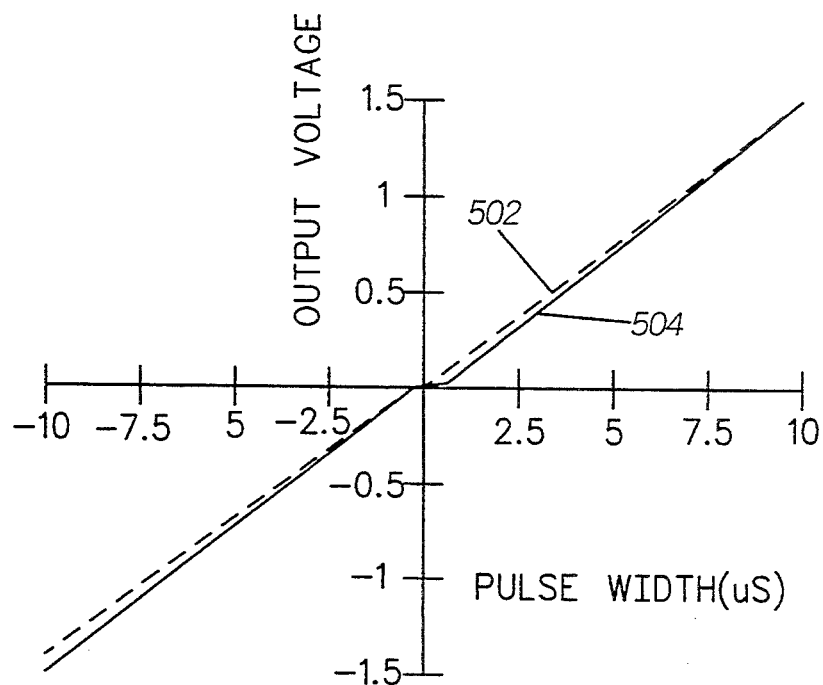
Figure 6:
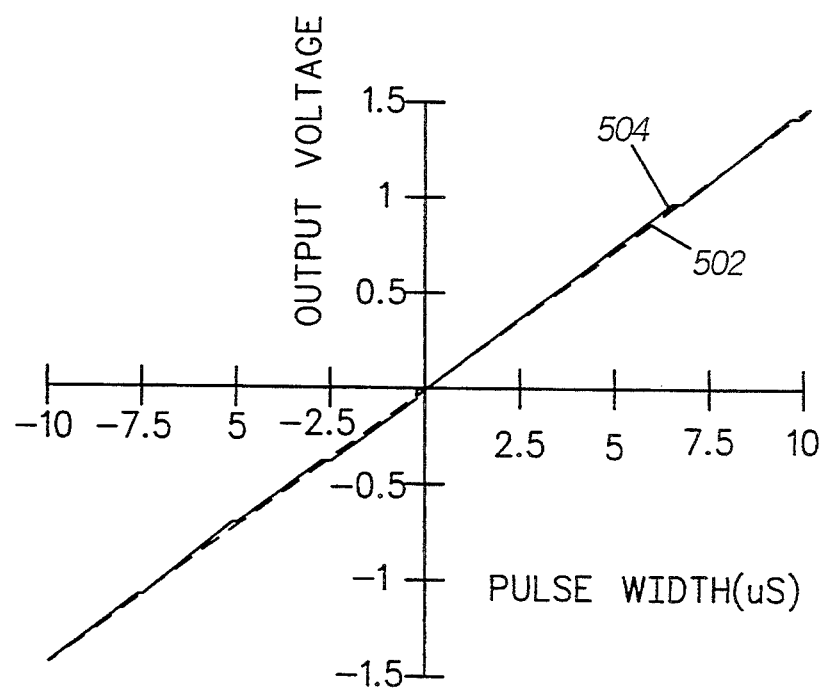
Figure 7:
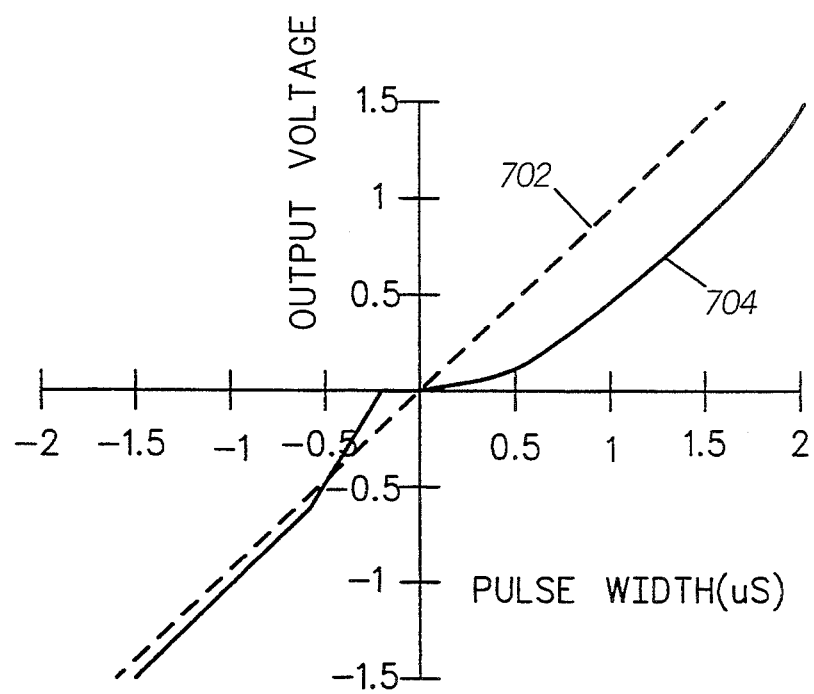
Figure 8:
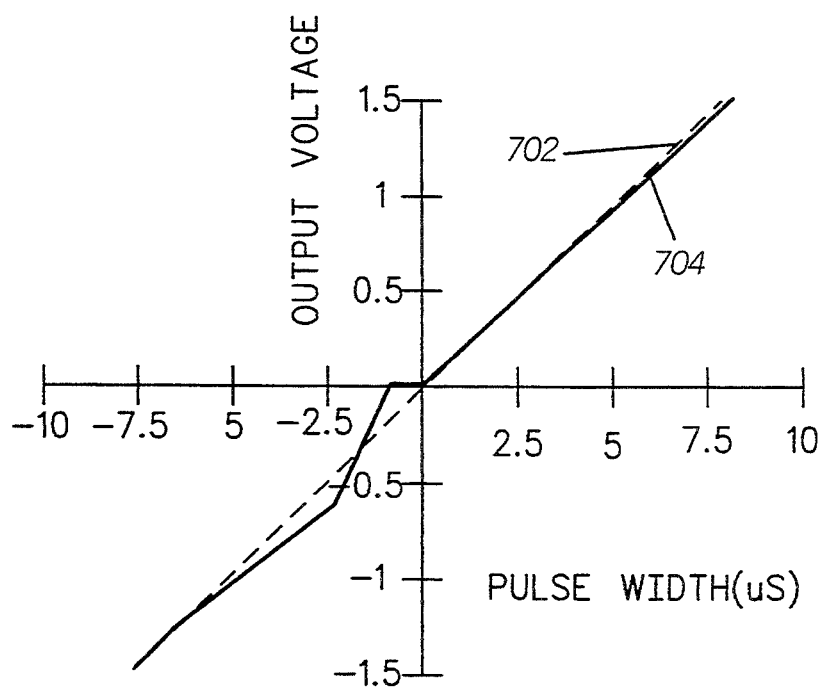

FIGS. 3, 5 and 7 show the distortions that occur in a PWM amplifier such as amplifier 100, shown at different scales. FIGS. 4, 6 and 8 show the same signals reduced in distortion by using the compensation or predistortion technique of the present invention. The distortion shown in FIGS. 3, 5 and 7 are caused by several factors such as the turn on/turn off characteristics of FETs 142–146 and 118, 122 and 128. Also evident is distortion caused by the different electrical characteristics in the high and low side of the FET bridge drivers and bootstrap circuit. These distortions are evident as amplitude variations from the ideal. In each case, the variation from ideal can be partially compensated for by modifying the drive signal (pulsewidth) of signals 114, 158 and 160.

In the present invention this is done through the use of a look-up table which is stored in the built-in storage or memory section located in controller 102. The storage or memory section acts as a conversion means for converting the input signal into a compensated pulsewidth-modulated signal. In the present invention, amplifier 100 is characterized over the audio range without the use of any compensation, and corresponding compensated values are stored on an input amplitude basis in order to compensate for the circuits distortion characteristics. These pulsewidth compensation values are then stored in the storage section. As input signal 112 is sent into controller 102 and converted into digital signals in the form of 8 bit long words, the 8 bit long words are then used as pointers to locate their corresponding compensated signals in the built-in memory section.

The compensated signals are then used to generate the pulsewidth signals which will drive the bridge circuit. The resulting output signal vs. pulsewidth is shown in FIGS. 4, 6 and 8. As can be seen in FIG. 8, there is a limitation on the amount of compensation that can be performed through the use of a look-up table. In the example shown by the preferred embodiment, the compensated maximum resolution was 0.25 us at 0.1302 volts per us or 32.6 milli-volts. The larger the word size of the analog/digital converter and the more discrete compensation values which are stored in the storage section, the better the resolution of the compensation scheme.

Figure 9:
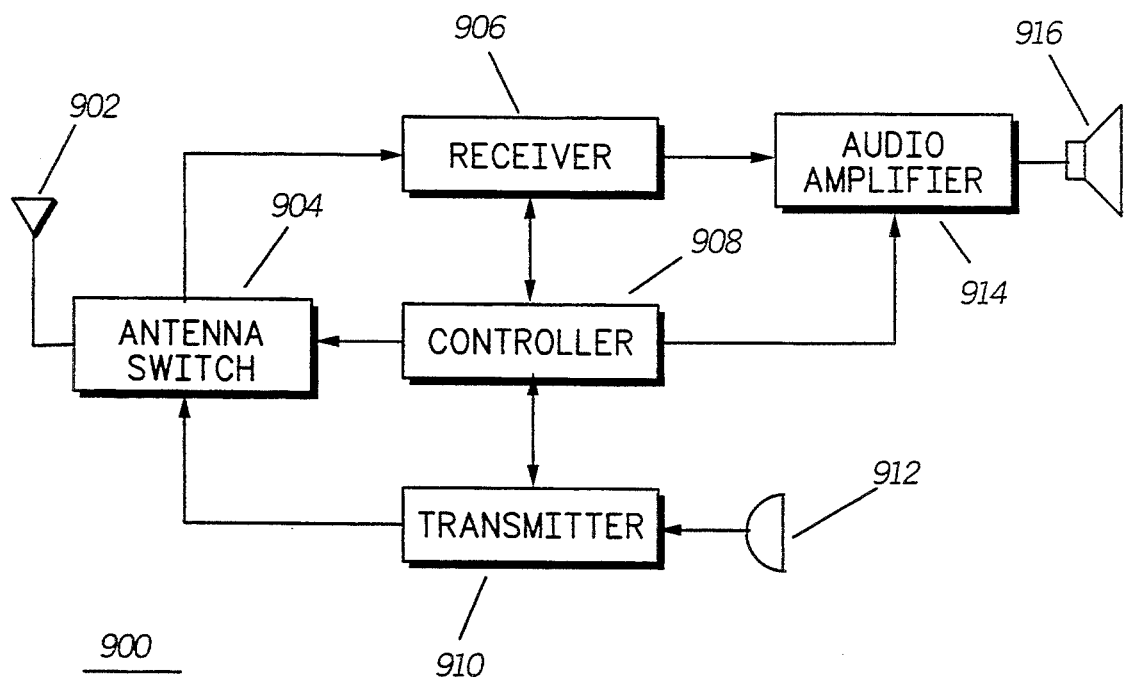
FIG. 9 is a block diagram of a radio in accordance with the present invention.

In FIG. 9, a block diagram of a radio 900 such as a two-way FM radio is shown. Radio 900 includes conventional receiver 906 and transmitter 910 sections selectively coupled to antenna 902 via antenna switch 904. A controller such as a M68HC11xx family microprocessor manufactured by Motorola, Inc. is used as the control means for radio 900. Controller 908 controls the operation of receiver 906 and transmitter 910 using control software stored in controller 908 and/or in external memory sections (not shown).

A distortion compensated audio amplifier section 914 similar to audio amplifier 100 is coupled to receiver 906 and provides for improved distortion characteristics. The output terminals of audio amplifier 914 are in turn coupled to speaker 916 for presentation of the audio to the radio user. A microphone 912 is coupled to transmitter 910 for presentation of voice signals to transmitter 910.

Figure 10:
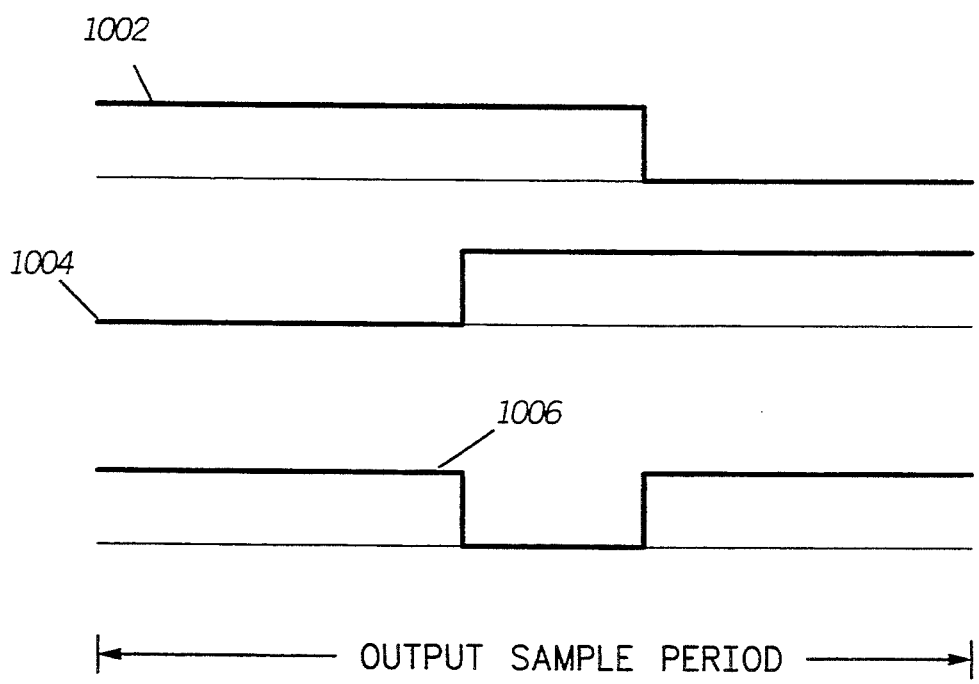
FIG. 10 shows the set of signals which generate a pulsewidth waveform for use in accordance with the present invention.

Since the controller used in the preferred embodiment does not have a built-in pulsewidth modulator which can generate a pulse which is centered with respect to each sample period, the compensated PWM signal is generated in the preferred embodiment with the help of external hardware. In FIG. 10, signal 1002 corresponds to signal 158 in FIG. 1, while signal 1004 corresponds to signal 160. The two output signals are then sent through exclusive-or logic gate 156 in order to form PWM signal 1006 which corresponds to signal 126 in FIG. 1. Signals 158 and 160 come from the output compare functions of the internal timer of controller 102. This allows for the pulse to be generated in the middle of the output sample, and therefore the compensated PWM signal is centered in the output sample period. This provides for better distortion compensation in that the compensation provided by the present invention is equally distributed to both sides of the PWM signal. The compensated PWM signal of the present invention does not shift the PWM signal from only one side one which would provide for less than optimum compensation. This centering of the compensated PWM signal provides for an advantage over present PWM amplifiers.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

In summary, the present invention provides for an improved PWM amplifier. The PWM amplifier provides for improved distortion characteristics by compensating (predistorting) the input signal in order to compensate for electrical non-linear distortions inherent in the amplifier's design. A look-up table providing for the compensated pulsewidth values is located as part of the amplifier. As pulsewidth values are selected from the table they are provided to the bridge circuit in order to drive the amplifier's load.

What is claimed is:

1. A pulsewidth-modulated amplifier, comprising:
   an input terminal for receiving a variable input signal; and
   controller means responsive to the variable input signal for providing a distortion compensated pulsewidth-modulated signal corresponding to the variable input signal, the controller means includes means for sampling the variable input signal and includes conversion means for providing a corresponding distortion compensated pulsewidth-modulated signal.

2. A pulsewidth-modulated amplifier as defined in claim 1, further comprising:
   a speaker coupled to the controller means and driven by the distortion compensated pulsewidth-modulated signal.

3. A pulsewidth-modulated amplifier as defined in claim 1, wherein the controller means converts the variable input signal into a plurality of discrete signals.

4. A pulsewidth-modulated amplifier comprising:
   an input terminal for receiving a variable input signal; and
   controller means responsive to the variable input signal for providing a distortion compensated pulsewidth-modulated signal corresponding to the variable input signal, the controller means includes means for sampling the variable input signal and includes a conversion means for providing a corresponding distortion compensated pulsewidth-modulated signal for every sample period, and the distortion compensated pulsewidth-modulated signal provided by the controller is centered with respect to each for each sample period.

5. A pulsewidth-modulated amplifier as defined in claim 1, wherein the variable input signal is a variable analog signal and the controller means is a microprocessor.

6. A pulsewidth-modulated amplifier as defined in claim 1, further comprising:
- a bridge circuit having first and second load terminals coupled to the controller means;
- a speaker coupled between the first and second load terminals; and
- the bridge circuit in response to the distortion compensated pulsewidth modulated signal drives the speaker.

7. A pulsewidth-modulated amplifier, comprising:
- an input terminal for receiving a variable input signal; and
- controller means responsive to the variable input signal for providing a distortion compensated pulsewidth-modulated signal corresponding to the variable input signal, the controller means converting the variable input signal into a plurality of discrete signals; and the controller means further comprising a look-up table having a plurality of discrete pulsewidth signals, and the controller matching each of the plurality of discrete signals to one of the plurality of discrete pulsewidth signals in the look-up table in order to generate the distortion compensated pulsewidth-modulated signal.

8. A communication device, comprising:
- a receiver providing a variable signal; and
- a pulsewidth-modulated audio amplifier responsive to the variable signal, the pulsewidth-modulated audio amplifier comprising:
  - an input terminal for receiving the variable signal; and
  - controller means responsive to the variable signal for providing a distortion compensated pulsewidth-modulated signal corresponding to the variable signal the controller means includes means for sampling the variable input signal and includes a conversion means for providing a corresponding distortion compensated pulsewidth-modulated signal.

9. A communication device as defined in claim 8, wherein the controller means converts the variable signal into a plurality of discrete signals prior to providing the compensated pulsewidth-modulated signal.

10. A communication device as defined in claim 8, wherein the variable signal is a variable analog signal and the controller means is a microprocessor.

11. A communication device comprising:
- a receiver providing a variable signal;
- a pulsewidth-modulated audio amplifier responsive to the variable signal the pulsewidth-modulated audio amplifier comprising:
  - an input terminal for receiving the variable signal; and
  - controller means responsive to the variable signal for providing a distortion compensated pulsewidth-modulated signal corresponding to the variable signal; the controller means converting the variable signal into a plurality of discrete signals prior to providing the compensated pulsewidth-modulated signal, the controller means further comprising a storage section having a plurality of discrete pulsewidth signals, and the controller means matching each one of the plurality of discrete signals to one of the plurality of discrete pulsewidth signals in order to generate the distortion compensated pulsewidth-modulated signal.

12. A communication device as defined in claim 11, further comprising:
- a bridge circuit having first and second load terminals coupled to the controller means;
- a speaker coupled between the first and second load terminals; and
- the bridge circuit in response to the distortion compensated pulsewidth modulated signal drives the speaker.

* * * * *

UNITED STATES PATENT AND TRADEMARK OFFICE
CERTIFICATE OF CORRECTION

PATENT NO. : 5,438,694
DATED : August 1, 1995
INVENTOR(S) : Muri, et al.

It is certified that error appears in the above-indentified patent and that said Letters Patent is hereby corrected as shown below:

Column 5, claim 7, line 24, after "controller" and before "matching" insert --means--.

Column 5, claim 7, line 25, after "each" and before "of" insert --one--.

Column 5, claim 8, line 39, after "signal" insert --,--.

Column 5, claim 8, line 41, after "includes" and before "conversion" delete "a".

Column 6, claim 11, line 13, after "signal" insert --,--.

Signed and Sealed this

Twelfth Day of December, 1995

Attest:

BRUCE LEHMAN

*Attesting Officer*   *Commissioner of Patents and Trademarks*